(12) United States Patent
Lee et al.

(10) Patent No.: US 11,276,614 B2
(45) Date of Patent: Mar. 15, 2022

(54) TESTING OF LED DEVICES DURING PICK AND PLACE OPERATIONS

(71) Applicant: ASM Technology Singapore Pte Ltd, Singapore (SG)

(72) Inventors: Shun Yan Lee, Hong Kong (HK); Sai Kit Wong, Hong Kong (HK); Chi Wah Yuen, Hong Kong (HK); Ka Yee Mak, Hong Kong (HK); Gary Peter Widdowson, Hong Kong (HK)

(73) Assignee: ASM TECHNOLOGY SINGAPORE PTE LTD, Singapore (SG)

(*) Notice: Subject to any disclaimer, the term of this patent is extended or adjusted under 35 U.S.C. 154(b) by 0 days.

(21) Appl. No.: 16/944,206

(22) Filed: Jul. 31, 2020

(65) Prior Publication Data

US 2022/0037213 A1 Feb. 3, 2022

(51) Int. Cl.
*H01L 21/66* (2006.01)
*H01L 33/00* (2010.01)
*G01R 31/26* (2020.01)

(52) U.S. Cl.
CPC ............ *H01L 22/14* (2013.01); *H01L 22/22* (2013.01); *H01L 22/24* (2013.01); *H01L 22/30* (2013.01); *H01L 33/005* (2013.01); *G01R 31/2635* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 10,186,549 B1* | 1/2019 | Cheung | H01L 24/81 |
| 2015/0194565 A1* | 7/2015 | Solarz | B07C 5/342 |
| | | | 438/15 |
| 2018/0269234 A1* | 9/2018 | Hughes | H01L 27/1248 |
| 2019/0018057 A1* | 1/2019 | Pappas | G01R 31/2635 |
| 2019/0027075 A1* | 1/2019 | Hughes | H01L 27/156 |
| 2020/0020825 A1* | 1/2020 | Yang | H01L 33/30 |
| 2020/0194616 A1* | 6/2020 | Henley | H01L 22/14 |
| 2020/0227328 A1* | 7/2020 | Anjum | H01L 22/34 |
| 2020/0379029 A1* | 12/2020 | Hasegawa | G01R 31/2656 |
| 2021/0057291 A1* | 2/2021 | Chang | H01L 33/62 |
| 2021/0243894 A1* | 8/2021 | Chaji | H01L 21/6835 |
| 2021/0249558 A1* | 8/2021 | Tsai | H01L 21/6835 |

* cited by examiner

*Primary Examiner* — Alexander G Ghyka
(74) *Attorney, Agent, or Firm* — Ostrolenk Faber LLP

(57) ABSTRACT

A pick and place LED testing apparatus, comprising: a test station operative in use to power a group of LEDs; a bondhead operative in use to pick said group of LEDs from a source wafer and place said group of LEDs on said test station for testing; and an optical sensor operative in use to measure an optical characteristic of said group of LEDs when tested, wherein at least a portion of said bondhead is translucent to provide an optical path from said group of LEDs to said optical sensor.

19 Claims, 8 Drawing Sheets

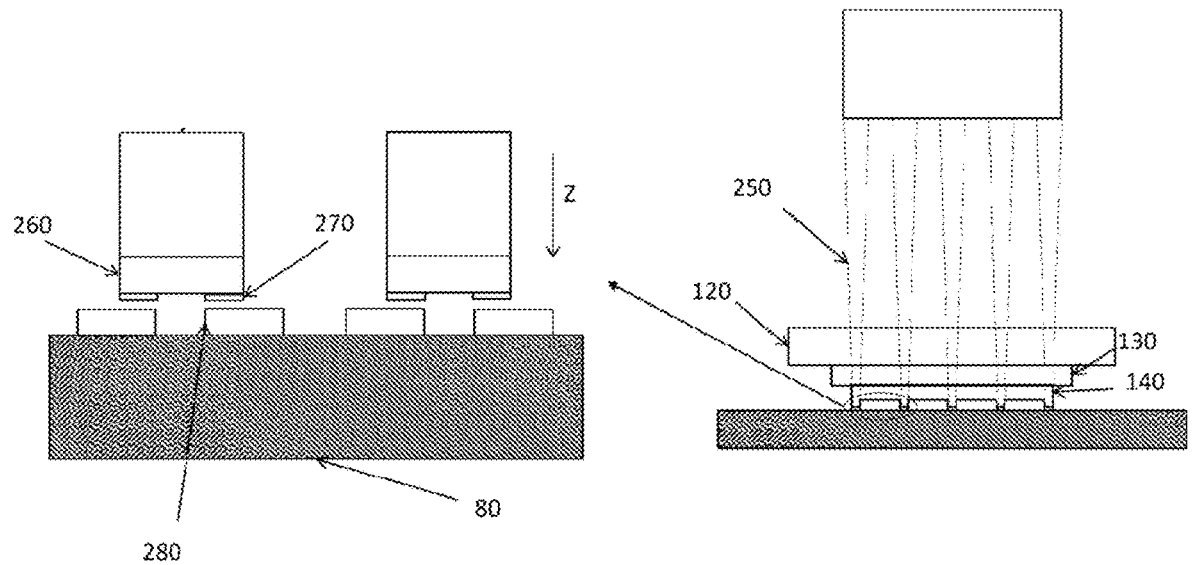
FIG. 4A  FIG. 4B
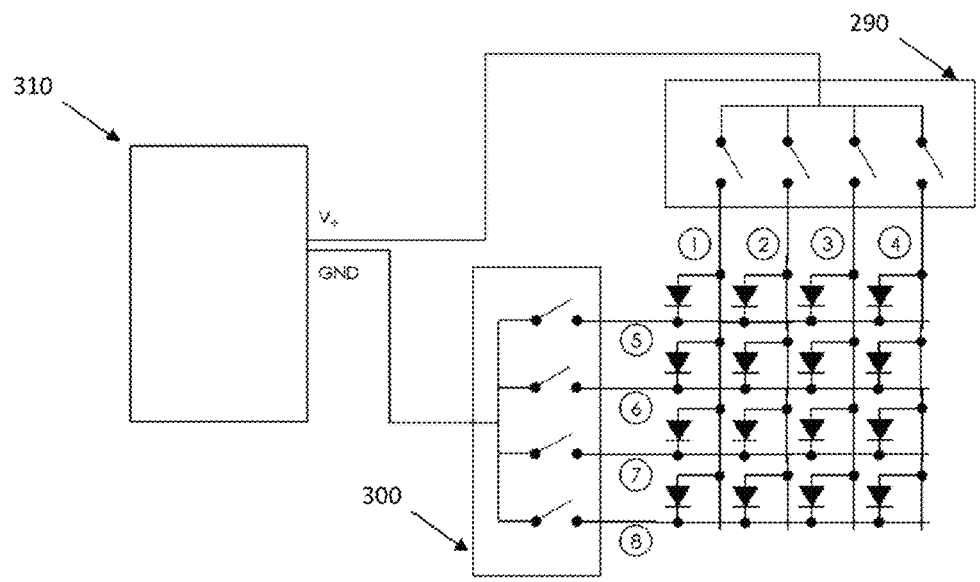
FIG. 5

TESTING OF LED DEVICES DURING PICK AND PLACE OPERATIONS

FIELD OF THE INVENTION

The invention relates to an apparatus and method for testing light emitting diode (LED) devices during pick and place operations.

BACKGROUND

Techniques for testing LEDs exist. Such techniques typically pick an LED and then place it against an electrical circuit to provide electrical power to perform optical and/or electrical characteristic testing in order to verify the characteristics and operation of that LED. However, apparatus for performing such testing can be slow, complex and less compact than is desirable.

It would be beneficial to provide an arrangement which is faster, simpler and more compact as compared to the prior art.

SUMMARY OF THE INVENTION

It is thus an object of this invention to seek to provide an arrangement which overcomes at least some of the aforementioned problems of the prior art.

According to a first aspect of the present invention, there is provided a pick and place LED testing apparatus, comprising: a test station operative in use to power a group of LEDs; a bondhead operative in use to pick said group of LEDs from a source wafer and place said group of LEDs on said test station for testing; and an optical sensor operative in use to measure an optical characteristic of said group of LEDs when tested, wherein at least a portion of said bondhead is translucent to provide an optical path from said group of LEDs to said optical sensor.

Accordingly, a pick and place apparatus is provided. The apparatus may be for LED testing. The apparatus may comprise a test station or testbed which may power or activate a group of LEDs. The group of LEDs may comprise a plurality of LEDs. The apparatus may comprise a bond head which may pick the group of LEDs from a wafer and place that group of LEDs onto the test station to be tested. The apparatus may comprise an optical sensor which measures the optical characteristics of the group of LEDs on the test station. The bond head may be configured to provide an optical path which allows light from the LEDs to pass through the bond head to the optical sensor. In this way, the optical sensor can be located on the same side of the LEDs as the bond head, which reduces the complexity of the apparatus and provides for a more compact apparatus. Also, by testing groups of LEDs, the speed of the apparatus is improved.

The portion of the bond head may be translucent. That is to say, the portion of the bond head may allow for transmission of light therethrough.

The portion of the bond head may comprise a translucent holder which holds the group of LEDs such that the optical path passes at least partially through the translucent holder. That is to say, the translucent holder forms part of the optical path between the LEDs and the optical sensor.

The translucent holder may comprise a plurality of protrusions extending from a surface of the bond head towards the group of LEDs. Typically, a single protrusion is provided for a corresponding single LED within the group of LEDs.

The plurality of protrusions may comprise an array of protrusions, each protrusion being spaced from another protrusion by an integer multiple of a pitch between LEDs from the source wafer. Accordingly, the array of protrusions may be configured such that every nth LED is contacted by a single, corresponding protrusion.

The translucent holder may be elastic and provide for contact adhesion between the translucent holder and at least one LED from the group of LEDs. Typically, a single protrusion adheres to a single corresponding LED from the group of LEDs.

The translucent holder may pick up the group of LEDs by contacting with a major light emitting surface of each LED within the group.

The translucent holder may pick up the group of LEDs by contacting with a surface of each LED other than a surface having electrical contacts. In other words, the translucent holder performs contact adhesion with a surface of the LEDs which fails to have electrical contacts. This leaves the electrical contacts exposed for electrical contact with the test station.

The portion of the bond head may comprise an optical assembly which redirects light emitted by each LED from a major light emitting surface of each LED in an emission direction towards the bond head to a redirected direction which is transverse to the emission direction. In other words, the optical assembly alters the optical path in a direction which is transverse to the main emission direction of light from the LEDs.

The optical sensor may be mounted on a side of the bond head to align with the redirected direction.

The test station may comprise a group of electrical contacts which power the group of LEDs during testing. The bond head may place the group of LEDs on the test station aligned with the group of electrical contacts to power the group of LEDs during testing.

The electrical contacts may be spaced apart by the integer multiple of the pitch between the LEDs from the source wafer. In other words, the contacts are located to be positionally aligned with the electrical contacts on the LEDs held by the bond head.

The integer multiple may be 3 or a multiple of 3.

The group of electrical contacts may face towards the bond head.

The bond head may place the group of LEDs on the test station aligned with the group of electrical contacts to power the group of LEDs during testing.

The apparatus may comprise an electrical tester which measures electrical characteristics of the group of LEDs on the test station during testing. Hence, the electrical tester may measure the voltage and/or current of the group of LEDs, subgroups of the LEDs and/or individual LEDs during testing.

The optical sensor may identify defective LEDs within the group of LEDs as those which fail to achieve a selected threshold of a measured optical characteristic and/or a selected threshold of a measured electrical characteristic.

The apparatus may comprise a controller which controls the bond head to place the group of LEDs on a bin carrier based on or in response to the measured optical characteristics. Hence, the measured optical characteristics determine the bin carrier onto which the group of LEDs is placed.

The apparatus may comprise a plurality of bin carriers. Each bin carrier may receive a group of LEDs from the bond head based on or in response to the measured optical characteristics. A mixture of LEDs of different colour coordinates within each bin carrier may share similar measured optical characteristics. Hence, each bin carrier may carry LEDs of different colour coordinates but each group of LEDs within the bin carrier may have similar optical characteristics.

The apparatus may comprise a plurality of bin carriers. Each bin carrier may receive the group of LEDs from the bond head based on or responsive to the measured optical characteristics. A mixture of LEDs of different colour coordinates within each bin carrier may fall within a range of measured optical characteristics for that bin carrier. Hence, each bin carrier may carry LEDs of different colour coordinates but each group of LEDs within the bin carrier may fall within the same range of optical characteristics.

The apparatus may comprise a gang bonding carrier which receives groups of LEDs from the same bin carrier in a predetermined or selected arrangement which comprises a mixture of LEDs of different colour coordinates. The gang bond carrier may be used to bond such groups of LEDs onto an LED display system in a selected or predetermined arrangement of bonding.

The apparatus may comprise a tool which performs a removal and/or a replacement of defective LEDs that are received on the gang bonding carrier.

The optical characteristic may comprise an intensity and/or a colour coordinate of the group of LEDs.

The intensity may comprise an average intensity of the group of LEDs and the colour coordinate may comprise an average colour coordinate of the group of LEDs.

According to a second aspect, there is provided a method, comprising: picking a group of LEDs from a source wafer using a bond head and placing said group of LEDs on a test station for testing; powering said group of LEDs on said test station; and measuring an optical characteristic of said group of LEDs using an optical sensor, at least a portion of said bond head allowing light to pass at least partially through the bond head to provide an optical path from said group of LEDs to an optical sensor.

The portion of said bond head may be translucent.

The portion of said bond head may comprises a translucent holder and said picking may comprise holding said group of LEDs with said translucent holder such that the optical path passes at least partially through the translucent holder.

The translucent holder may comprise a plurality of protrusions extending from a surface of said bond head towards said group of LEDs.

The plurality of protrusions may comprise an array of protrusions, each protrusion may be spaced from another protrusion by an integer multiple of a pitch between LEDs from the source wafer.

The translucent holder may be elastic and may provide for contact adhesion between said translucent holder and at least one LED from said group of LEDs.

The picking may comprise picking up said group of LEDs by contacting a major light-emitting surface of each LED with said translucent holder.

The picking may comprise picking up said group of LEDs by contacting a surface of each LED other than a surface of each LED having electrical contacts with said translucent holder.

The method may comprise redirecting light emitted by each LED from the major light-emitting surface of each LED in an emission direction towards said bond head to a redirected direction which is transverse to said emission direction using said portion of said bond head comprising an optical assembly.

The optical sensor may be mounted on a side of said bond head to align with said redirected direction.

The placing may comprise placing said group of LEDs on said test station aligned with a group of electric contacts provided by said test station and said powering may comprise powering said group of LEDs with said group of electrical contacts.

The method may comprise measuring electrical characteristics of said group of LEDs on said test station with an electrical tester.

The measuring may comprise identifying defective LEDs within said group of LEDs which fail to achieve at least one of a selected threshold of said measured optical characteristics and a selected threshold of said measured electrical characteristics.

The method may comprise receiving said group of LEDs from the bond head onto one of a plurality of bin carriers based on said measured optical characteristics, wherein a mixture of LEDs of different colour coordinates within each bin carrier share similar measured optical characteristics.

The method may comprise receiving said group of LEDs from the bond head onto one of a plurality of bin carriers based on said measured optical characteristics, wherein a mixture of LEDs of different colour coordinates within each bin carrier fall within a range of measured optical characteristics for that bin carrier.

The method may comprise receiving groups of LEDs comprising a mixture of LEDs of different colour coordinates from the same bin carrier in a predetermined arrangement onto a gang bonding carrier and bonding such groups of LEDs onto an LED display system in the predetermined arrangement.

The method may comprise performing a removal and/or a replacement of defective LEDs that are received on the gang bonding carrier using a tool.

The optical characteristics may comprise at least one of an intensity and a colour coordinate of said group of LEDs.

The intensity may comprise an average intensity of said group of LEDs and said colour coordinate comprises an average colour coordinate of said group of LEDs.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which:

FIG. 4A and FIG. 4B illustrate schematically the test board in more detail;

FIG. 5 illustrates schematically a selective interconnect;

In the drawings, like parts are denoted by like reference numerals.

DETAILED DESCRIPTION

Before discussing the embodiments in any more detail, first an overview will be provided. Some embodiments provide a pick and place LED testing apparatus which has a bond head configured to allow light from a group of LEDs to pass at least partially through it during testing. This enables groups of LEDs to be picked from a source wafer, placed on a test board for optical, and optionally electrical, testing. The optical, and optionally electrical, characteristics of that group of LEDs are determined and the LEDs are then placed on one of a plurality of different bin carriers depending on an average optical, and optionally electrical, characteristic of that group of LEDs. This means that each of the different bin carriers fills with groups of LEDs having similar optical characteristics. An example of an optical characteristic is a colour coordinate of an LED, wherein each value in a colour coordinate represents a position of a colour in a colour space, such as different shades of a certain colour.

In some embodiments, each bin carrier is filled with groups of LEDs of different colour coordinates which share similar average optical characteristics. This means that each bin carrier contains LEDs of different colour coordinates which have similar optical characteristics. This allows different groups of LEDs with varying colour coordinates within a bin to be picked and placed onto a gang bonding carrier for use in forming a colour display with varying colour coordinates, and enables each display to be formed from LEDs of different colour coordinates, each sharing similar optical characteristics to provide for a more uniform display. Furthermore, this approach can help address problems with existing optical testing approaches which can be inconvenient in production, or cannot distinguish between LED problems, substrate problems, or bonding problems, and which may lead to incorrect correlation. The results may also not be precise enough to conduct sorting (and so may affect the colour consistency of the display). This may also lead to situations of over-rejection of good LEDs or passing of defective LEDs. In addition, this approach can help address problems with existing electrical testing approaches which can be limited to LEDs with sapphire material and of sizes of at least 90 um, because of the limitation of probe pin sizes and minimum pin-to-pin distances. Further, pin contact stresses can be too large and may damage the electrodes of the microLEDs and would be suitable only for lateral type LEDs or flip chip type LEDs.

Pick and Place Apparatus

Figure 1:
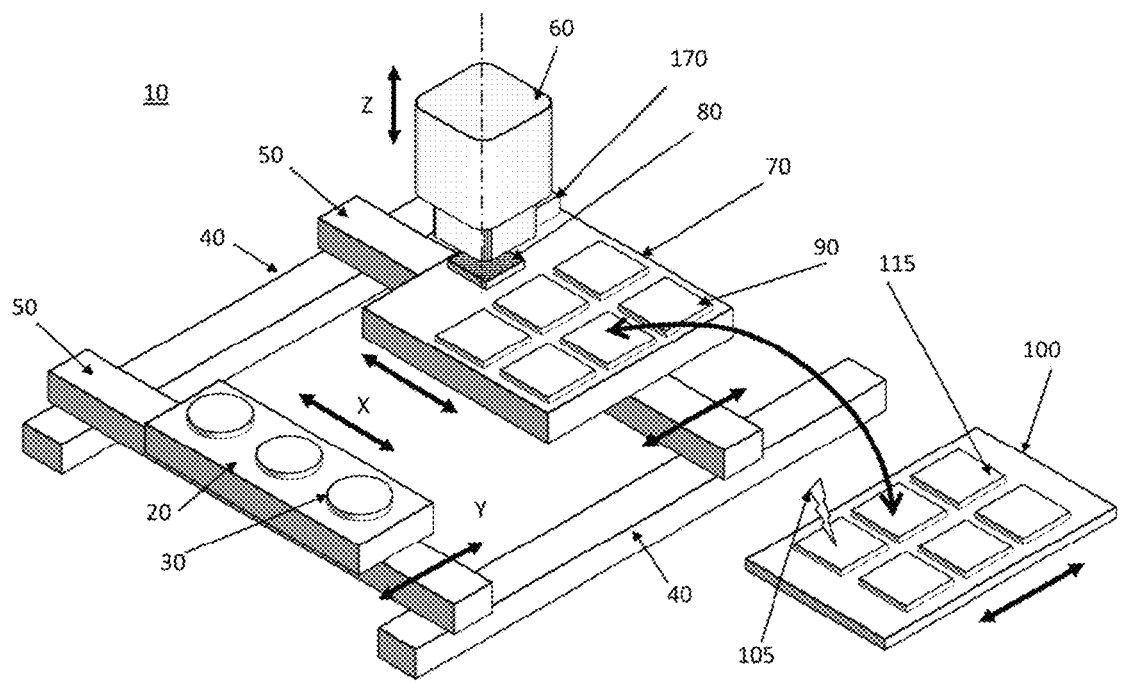
FIG. 1 illustrates schematically a pick and place LED testing apparatus according to one embodiment.

FIG. 1 illustrates schematically a pick and place LED testing apparatus 10 according to one embodiment. A source wafer station 20 is provided which has a plurality of source wafers 30 thereon. Each source wafer 30 may contain an array of LEDs, such as micro-LEDs in the form of flip-chip type micro-LEDs. X actuators 40 and Y actuators 50 enable the source wafer station 20 to be moved along X and Y axes with respect to a bond head 60. A pedestal 70 is provided which carries a test board 80 and a plurality of bin carriers 90. The X actuators 40 and the Y actuators 50 enable the pedestal 70 to be moved along the X and Y axes with respect to the bond head 60. A tray 100 is provided which carries a plurality of gang bond carriers 115. The tray 100 is moveable with respect to the bond head 60 along the X and Y axes. The bond head 60 is also moveable with respect to the source wafer station 20, the pedestal 70 and the tray 100 along a Z axis, which is transverse to the X and Y axes. A removal tool 105 is provided which removes and optionally replaces defective LEDs from the gang bond carriers 115, as will be explained in more detail below.

Bond Head

Figure 2A:
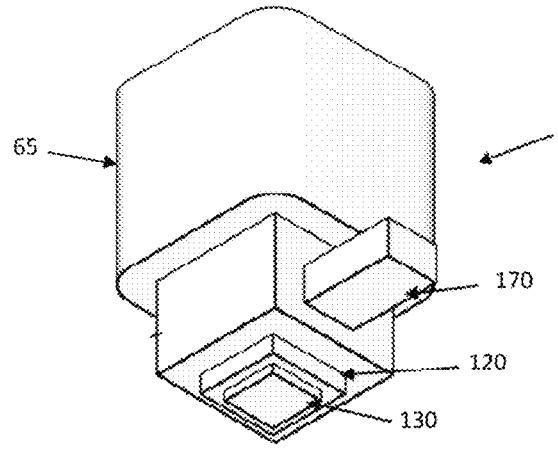
FIG. 2A is an isometric schematic view of the bond head.
Figure 2B:
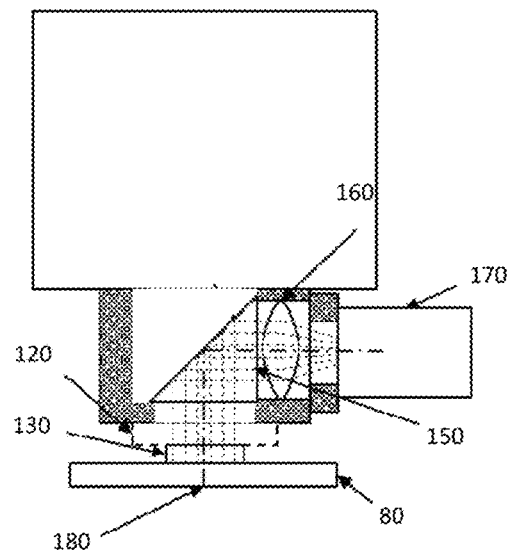
FIG. 2B is a schematic cross-section through the bond head.

FIG. 2A is an isometric schematic view of the bond head 60 and FIG. 2B is a schematic cross-section through the bond head 60. Extending from a main body 65 of the bond head 60 is an optical assembly enclosure 110 (see FIG. 3). Extending from the optical assembly enclosure 110 is a collet 120. Extending from the collet 120 is a base 130. Extending from the base 130 is a stamp 140. Within the optical assembly enclosure 110 is provided a prism 150 and a lens assembly 160. Attached to the optical assembly enclosure 110 is an optical sensor 170 such as a charge coupled device or a colour meter.

As will be explained in more detail below, the stamp 140, the base 130 and the collet 120 provide an optical path for light emitted from LEDs under test along an optical axis 180. The optical axis 180 is redirected by the prism 150 through the lens assembly 160 and onto the optical sensor 170. Hence, it can be seen that the bond head 60 provides an optical path which allows light to pass at least partially through the bond head 60 from LEDs under test to the optical sensor 170 in the optical assembly enclosure 110.

Figure 3:
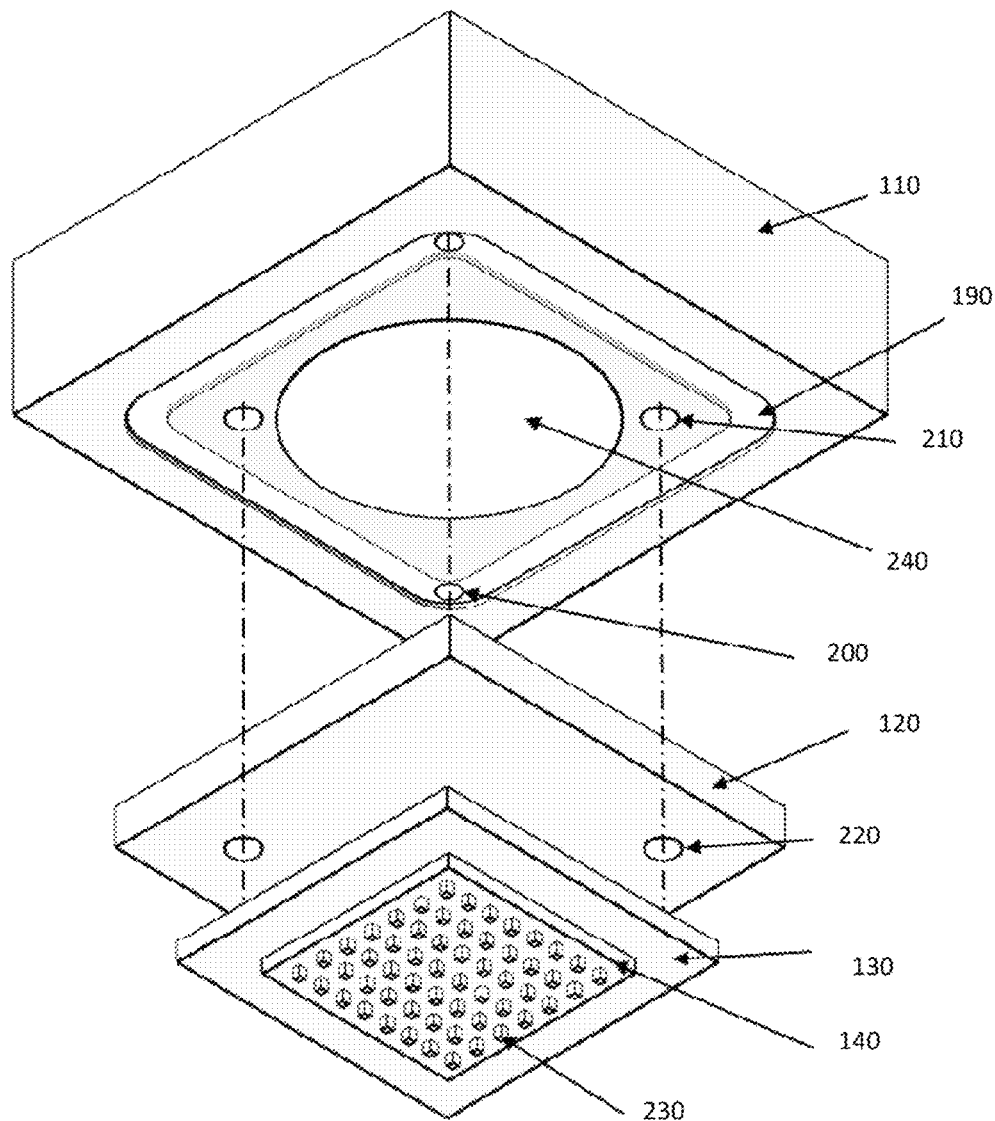
FIG. 3 is a partial exploded view of components attached to the optical assembly enclosure.

FIG. 3 is a partial exploded view of components attached to the optical assembly enclosure 110. As can be seen, the optical assembly enclosure 110 has a vacuum groove 190 which receives the collet 120. The vacuum groove 190 is in fluid communication with vacuum holes 200 which, when a vacuum is applied, holds the collet 120 in place against the optical assembly enclosure 110. Further vacuum holes 210 in the optical assembly enclosure 110 align with vacuum holes 220 in the collet 120. When a vacuum is applied, this also holds the base 130 against the collet 120.

As can be seen in FIG. 3, the stamp 140 has an array of columns 230 protruding from an exposed major face of the stamp 140. Each column 230 is dimensioned to match generally the dimensions of the micro-LEDs to be tested. Also, the distance or pitch between adjacent columns 230 is selected to be an integer multiple of the distance or pitch between LEDs from the source wafer 30. In this example, the columns 230 are positioned to pick every third LED from the source wafer 30, but it will be appreciated that different relative spacings may be provided. Also in this example, although it is illustrated that the size of the group of LEDs picked by the columns 230 is 56 LEDs, it should be appreciated that many more columns would be provided in practice in order to increase the number of LEDs to be picked up.

The columns 230, the stamp 140, the base 130 and the collet 120 are each translucent or transparent to allow light from the LEDs to pass through an aperture 240 in the optical assembly enclosure 110 to be conveyed to the optical sensor 170. Typically, the columns 230 and stamp 140 are formed from polydimethylsiloxane (PMDS). Typically, the base 130 and the collet 120 are formed from glass, quartz or sapphire glass.

Test Board

FIG. 4A and FIG. 4B illustrate schematically the test board 80 in more detail. As can be seen in FIG. 4B, LEDs 260 attached to the columns 230 are placed on the test board 80 and the columns 230, the stamp 140, the base 130 and the collet 120 provide an optical path for a light cone 250 from each LED 260 to project along the optical axis 180 into the optical assembly enclosure 110 and onto the optical sensor 170.

As can be seen in more detail in FIG. 4A, each LED 260 has electrodes 270 which make electrical contact with electrodes 280 on the exposed surface of the test board 80 which faces towards the bond head 60. Typically, the test board 80 is formed from a glass with the electrodes 280 printed on its surface. As the bond head 60 moves along the Z axis with respect to the test board 80, electrical contact between the electrodes 270 and the electrodes 280 occurs to enable the LEDs 260 to be powered and the light cones 250 to be generated. A slight compression from the elasticity of the columns 230 limit the pressure experienced by the LEDs 260 and provide for more reliable electrical connection with between the electrodes 270 and 280. This allows the optical sensor 170 to perform optical measurements of, for example, intensity, wavelength, colour (coordinate), flux and optical defect inspection for these measurements to be recorded for each LED 260 and for average values to be calculated and recorded for the group of LEDs 260.

FIG. 5 illustrates schematically a selective interconnect which can be used to power individual pairs of electrodes 280 so that individual LEDs 260 or sub groups of LEDs within the group of LEDs 260 placed on the test board 80 can be selectively powered as required through the use of switches 290, 300. A controller 310 controls the state of the switches 290, 300 and supplies a voltage across the pairs of electrodes 280. The electrical characteristics such as forward voltage and reverse current of the powered LEDs 260 can then be recorded.

Figure 6:
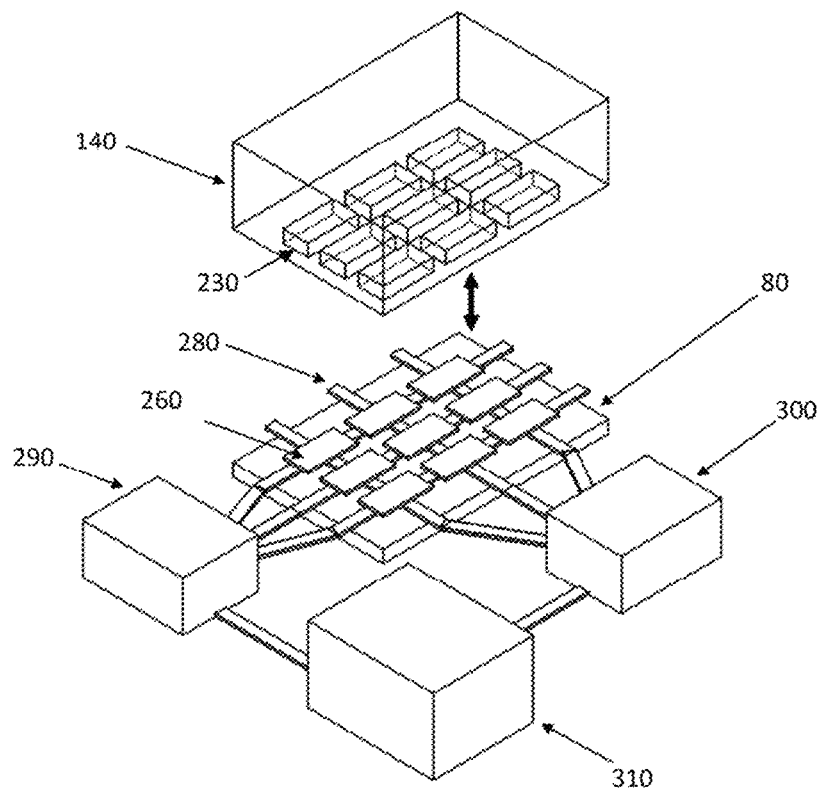
FIG. 6 shows schematically the group of LEDs positioned onto the electrodes using a stamp and columns for testing.

FIG. 6 shows schematically the group of LEDs 260 positioned onto the electrodes 280 by the stamp 140 and columns 230 for testing.

Figure 7:
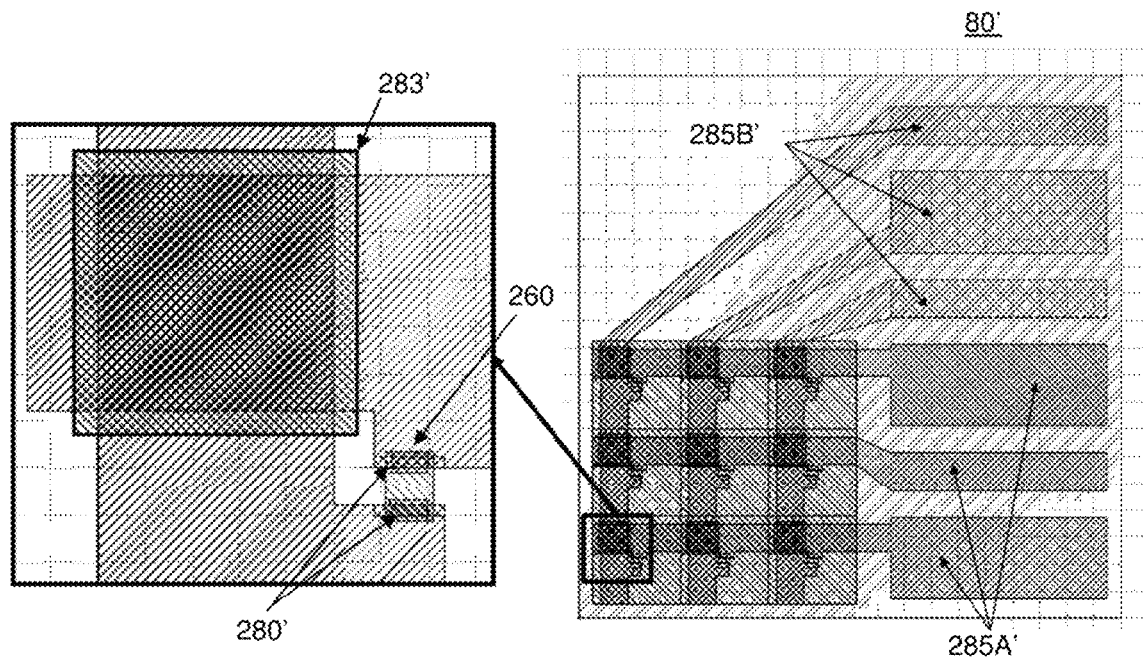
FIG. 7 shows an exemplary layout of a test board 80.

FIG. 7 shows an exemplary layout of a test board 80' configured to receive a group of nine LEDs formed in a 3×3 array. The LEDs 260 contact with electrodes 280'. The electrodes 280' are coupled with either a ground trace layer 285B' or a V+ trace layer 285A' which are printed on the surface of the test board 80' and separated by an insulating layer 283'.

LED Characterization

Figure 8:
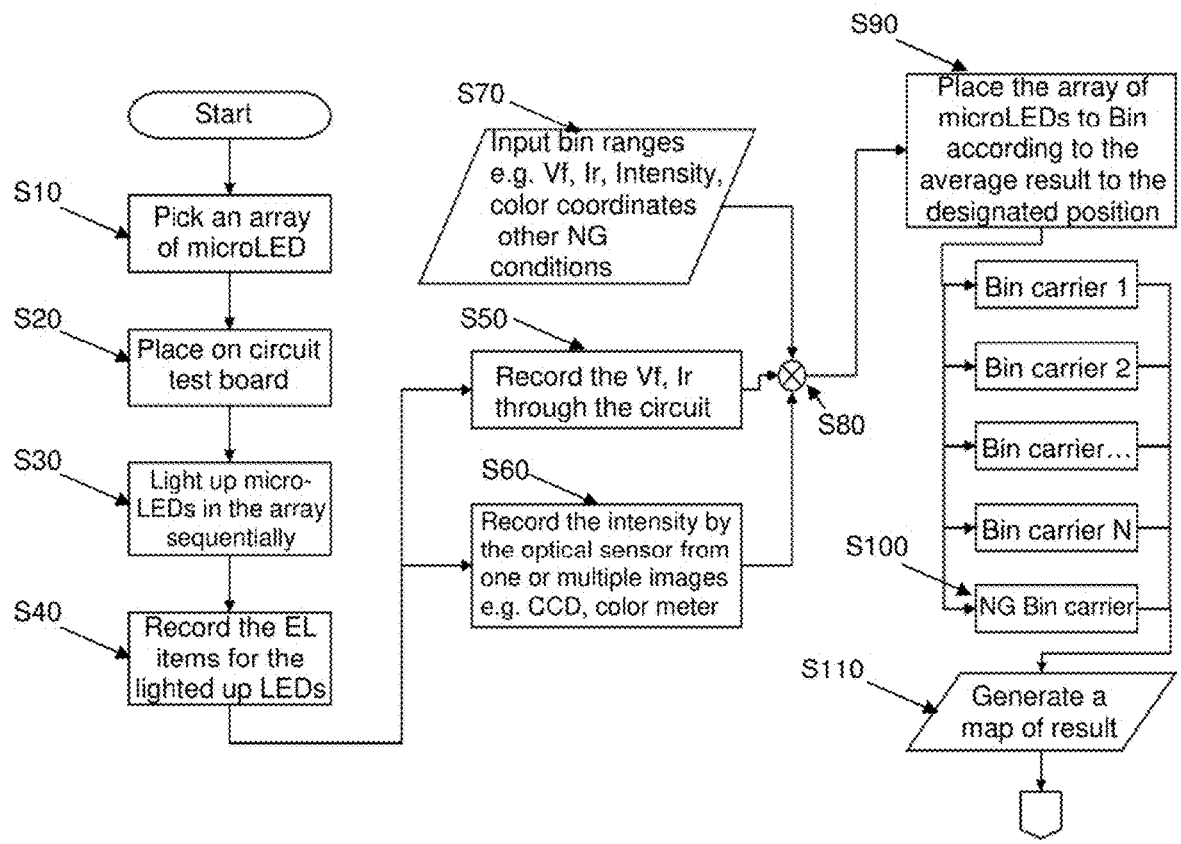
FIG. 8 is a flowchart illustrating the main steps for performing LED characterization.

FIG. 8 is a flowchart illustrating the main steps when performing LED characterization. At step S10, the bond head 60 is located above the source wafer station 20, over the array or group of LEDs 260 comprised in the source wafer 30 to be tested. The bond head 60 moves along the Z axis in the direction of the source wafer 30 and the columns 230 overlying the group of LEDs 260 press against those LEDs 260. The tackiness of the columns 230 causes the LEDs to adhere to the columns 230 and enables the LEDs 260 to be removed from the source wafer 30 as the bond head 60 moves away from the source wafer 30 along the Z axis.

At step S20, the bond head 60 is moved along the Z axis away from the source wafer 30 and the bond head 60 moves along the X and Y axes to overlie electrodes 280 on the test board 80. The bond head then moves along the Z axis towards the test board 80 and the electrodes 270 contact the electrodes 280.

Figure 9:
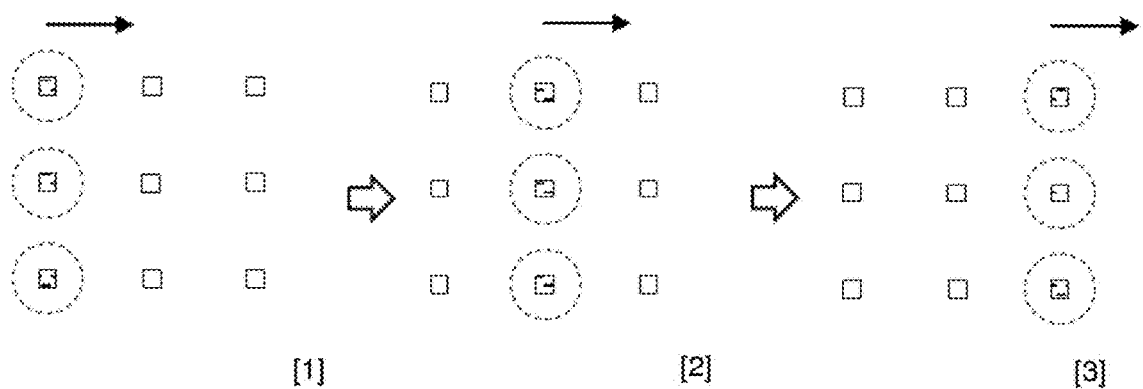
FIG. 9 illustrates powering columns of LEDs.

At step S30, the controller 310 and switches 290, 300 power to the group or sub groups of LEDs 260 on the test board 80. For example, as shown in FIG. 9 in [1] a first column of LEDs 260 are powered.

At steps S40, S50 and S60, the first column of LEDs 260 are powered such that individual light spots displayed on the optical sensor 170 have essentially no overlap. A power supply provides a constant current to the column of LEDs 260. A forward voltage (Vf) and a reverse current (Ir) across a circuit of each LED 260 is measured and recorded. Further, selected optical outputs (such as intensity and colour coordinates of each LED 260) measured by the optical sensor 170 is also measured and recorded for each LED 260. Thereafter, the controller 310 and the switches 290, 300 power the next column of LEDs, and the aforesaid parameters of voltage, reverse current and optical outputs of the LEDs in that column as shown in [2] are measured and recorded. Finally the controller 310 and the switches 290, 300 power the next column of LEDs to measure and record the aforesaid parameters for LEDs in that column as shown in [3].

An apparatus controller (not shown) is pre-programmed with characteristics or characteristic ranges to be stored by each bin carrier 90 at step S70.

An average electrical characteristic and optical characteristic for the complete group of LEDs 260 is compared against the bin carrier ranges at step S80.

Figure 10:
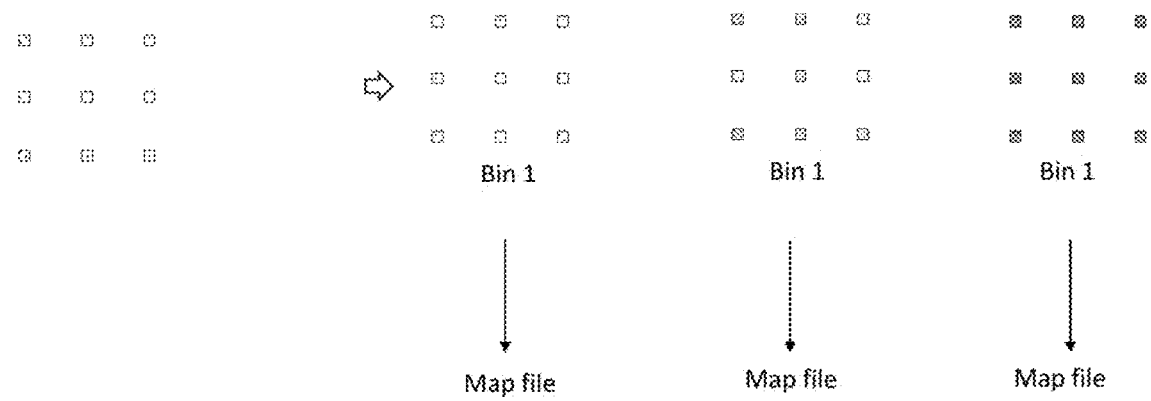
FIG. 10 illustrates placing a group of LEDs in the appropriate bin carrier.

At step S90, the group of LEDs 260 is then placed in the appropriate bin carrier 90 for that average electrical and optical characteristic, as illustrated in FIG. 10.

Should the average of the group of LEDs 260 fail to achieve a minimum expected threshold, then the group of LEDs 260 is placed in a no-good bin carrier at step S100.

At step S110, a map file for the bin carrier 90 that received the group of LEDs 260 is updated to indicate where the group of LEDs 260 have been placed within that bin carrier 90, and processing returns to step S10 to pick and characterize the next group of LEDs 260 from one of the wafers 30 until all the LEDs 260 have been picked, characterized and placed in an appropriate bin carrier 90.

Figure 11:
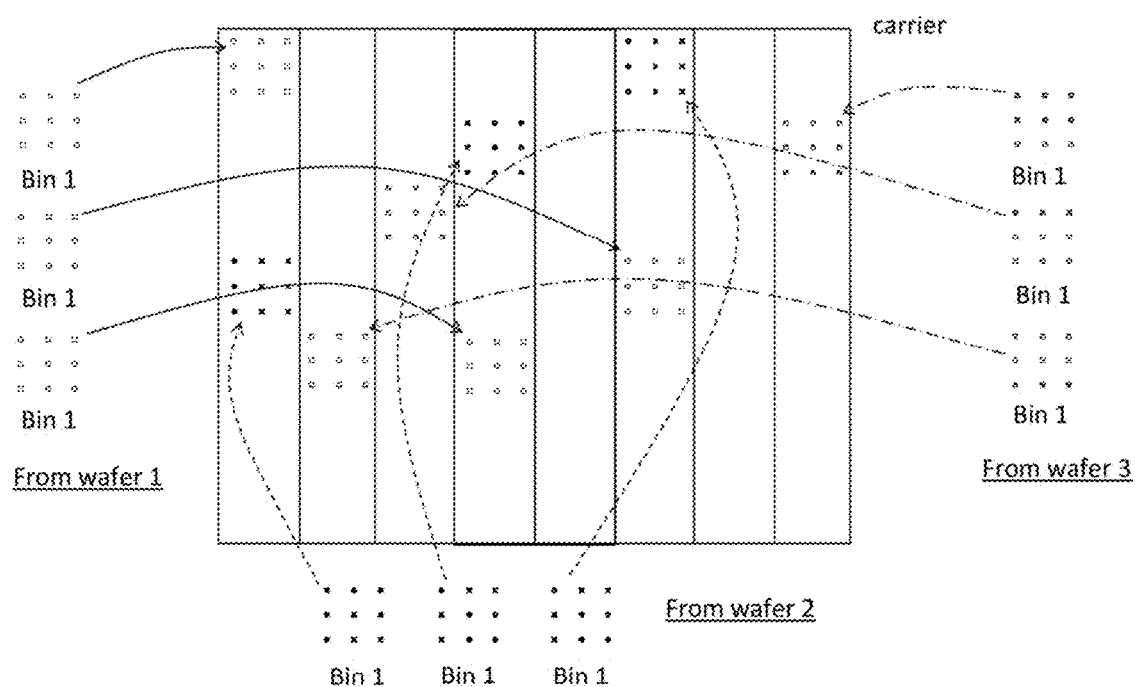
FIG. 11 illustrates the placing of different groups of LEDs onto a bin carrier.

FIG. 11 illustrates the placing of different groups of LEDs 260 onto a bin carrier 90. As can be seen, different groups of LEDs 260 from different wafers 30 are picked, tested and from their characteristics it is determined that they should be placed in the bin carrier 90 designated as bin 1. Accordingly, the groups of LEDs 260 from different source wafers 30 are placed in locations within bin 1 and the map file will indicate the locations of these groups of LEDs 260, together with the colour coordinate or which source wafer 30 those groups of LEDs 260 are from. Accordingly, it can be seen that each bin carrier 90 gradually gets filled with groups of different coloured LEDs 260, each sharing similar characteristics.

Gang Bond Carrier

Figure 12:
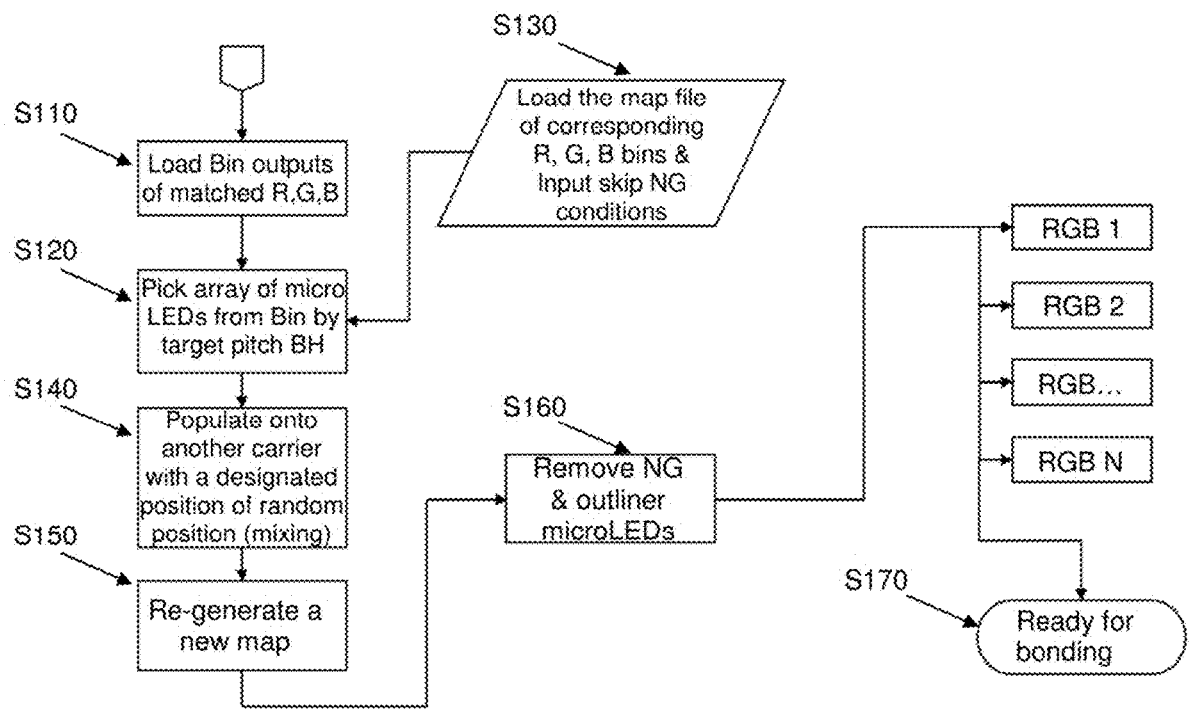
FIG. 12 illustrates the main processing steps for populating gang bond carriers.

FIG. 12 illustrates the main processing steps for populating the gang bond carriers 110.

At step S110, as mentioned above, the different bin carriers 90 each contain groups of LEDs 260 with similar characteristics.

At step S120, the bond head 60 is moved along the X and Y axes with respect to the pedestal 70 to overlie the intended bin carrier 90 which carries LEDs 260 with the required characteristics.

At step S130, the map of groups of LEDs within that bin carrier 90 is loaded. The apparatus controller selects an initial group of LEDs using the map file by locating the bond head 60 over that group of LEDs 260 and moving the bond head 60 along the Z axis towards the bin carrier 90 so that the columns 230 contact the LEDs 260 which then adhere to the columns 230.

At step S140, the bond head 60 moves along the Z axis away from the bin carrier 90 to remove the group of LEDs 260 from the bin carrier 90. The bond head 60 is moved with respect to the tray 100 along the X and Y axes to overlie the intended gang bond carrier 115. The bond head 60 then moves along the Z axis towards the gang bond carrier 115 to place the group of LEDs 260 onto the gang bond carrier 115 at the required position.

At step S150, a map for the gang bond carrier 115 is then generated to reflect the position of the group of LEDs 260 that have been placed on that gang bond carrier 115.

Figure 13:
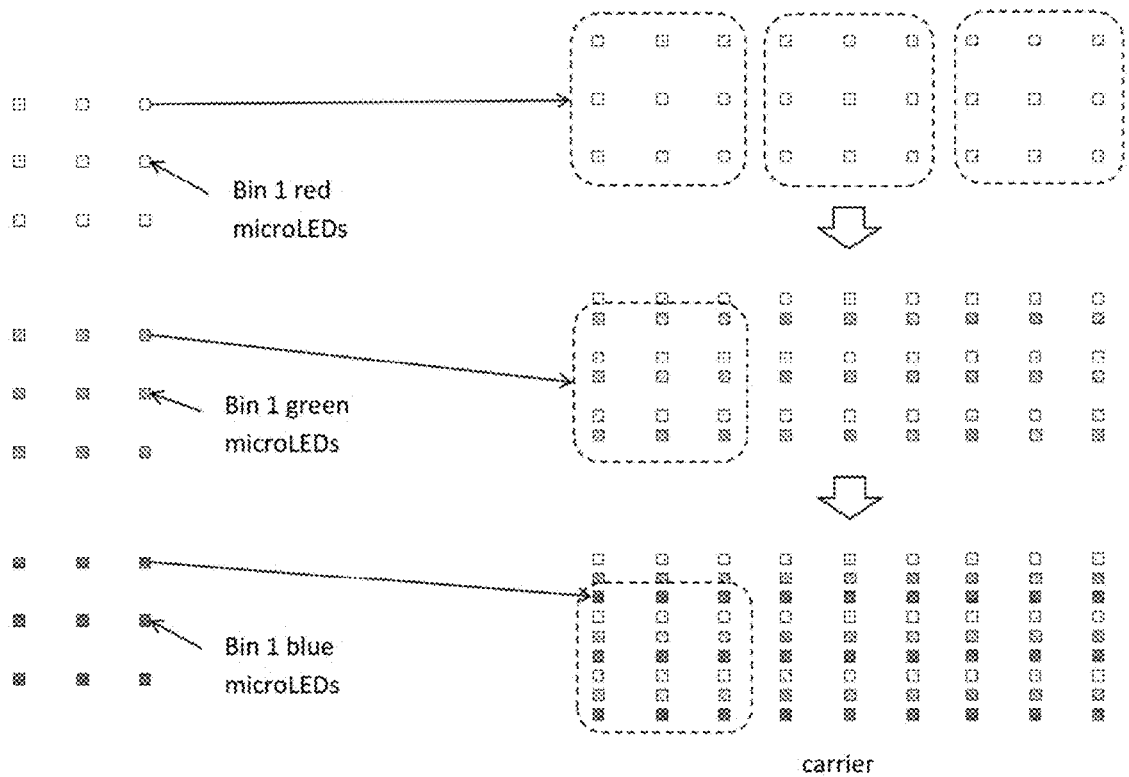
FIG. 13 illustrates populating the gang bond carriers in more detail.

FIG. 13 illustrates this process in more detail. As can be seen, initially groups of red LEDs 260 are selected from the bin carrier 90 designated as bin 1 and are placed on the gang bond carrier 115 at spaced intervals. Thereafter, groups of green LEDs 260 are selected from the bin carrier 90 designated as bin 1 and placed on the gang bond carrier 115 at a slightly offset position from the already placed red LEDs 260. Groups of blue LEDs 260 are then selected and from the bin carrier 90 designated as bin 1 and are placed on the gang bond carrier 115 at slightly offset positions. In this way, it can be seen that the gang bond carrier 115 is populated with red, green and blue LEDs each sharing similar or grouped characteristics in order to provide for a uniform display. It will be appreciated that although FIG. 13 illustrates populating the gang bond carrier 115 with single colours in a particular order, it will be appreciated that this need not be the case and that any groups of LEDs 260 from within the same carrier can be placed at any locations within the gang bond carrier 115 until all locations within the gang bond carrier 115 have been occupied.

Figure 14:
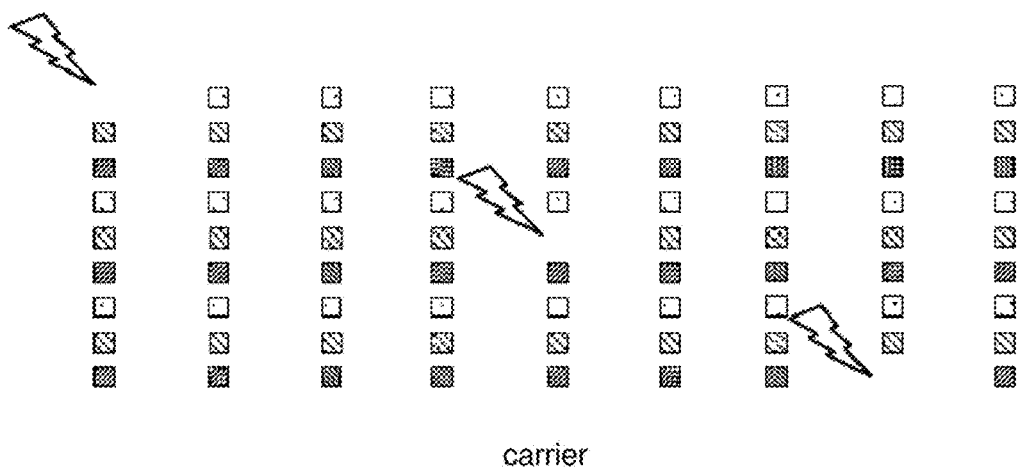
FIG. 14 illustrates the removal of defective LEDs from a gang bond carrier prior to bonding the LEDs.

Returning now to FIG. 12, at step S160, the removal tool 105 optionally removes and/or replaces any defective LEDs, specifically no-good and/or defective LEDs 260, from the gang bond carrier 115, as illustrated in FIG. 14 by reference to the map file. Those LEDs 260 may be simply omitted or replacement individual LEDs 260 added, if required. Once a gang bond carrier 115 is complete, then at step 170, a complete array of arranged LEDs placed on the gang bond carrier 115 is then removed for bonding at the same time to create the display.

Hence, it can be seen that in some embodiments, an elastic stamp is used to pick microLEDs to avoid damage during pick up. The elastic stamp may be made from AD300 to pick up and place LEDs onto a glass substrate to avoid damage during put down. The test board is made of glass, and the electrodes are made by electroplating them onto the glass substrate, and so are substantially flat, which has a reduced size concern and less stress concentration for avoiding damage. The electroluminescence (EL) test directly measures the electrical and optical properties of each LED die precisely without any need for correlation with other characteristics. The light from each microLED is directly captured and analysed, and sorting is further possible when optical properties of an individual die are known, which is desirable for display makers to fulfil industry standards of colour and intensity or brightness. Mixing is possible when optical properties of individual LED devices are known, which is desirable for a display maker to fulfil industry standards of colour and intensity or brightness, and for filtering out the no-good LEDs, which can dramatically improve the yield during the manufacture of display panels.

Although the present invention has been described in considerable detail with reference to certain embodiments, other embodiments are possible.

Therefore, the spirit and scope of the appended claims should not be limited to the description of the embodiments contained herein.

The invention claimed is:

1. A pick and place LED testing apparatus, comprising:
a test station operative in use to power a group of LEDs;
a bond head operative in use to pick said group of LEDs from a source wafer and place said group of LEDs on said test station for testing; and
an optical sensor operative in use to measure an optical characteristic of said group of LEDs during said testing, wherein at least a portion of said bond head allows light to pass at least partially through the bond head to provide an optical path from said group of LEDs to said optical sensor.

2. The apparatus of claim 1, wherein said portion of said bond head is translucent.

3. The apparatus of claim 1, wherein said portion of said bond head comprises a translucent holder operative in use to hold said group of LEDs such that the optical path passes at least partially through the translucent holder.

4. The apparatus of claim 3, wherein said translucent holder comprises a plurality of protrusions extending from a surface of said bond head towards said group of LEDs.

5. The apparatus of claim 4, wherein said plurality of protrusions comprise an array of protrusions, each protrusion being spaced from another protrusion by an integer multiple of a pitch between LEDs from the source wafer.

6. The apparatus of claim 3, wherein said translucent holder is elastic and provides for contact adhesion between said translucent holder and at least one LED from said group of LEDs.

7. The apparatus of claim 3, wherein said translucent holder is operative in use to pick up said group of LEDs by contacting a major light-emitting surface of each LED.

8. The apparatus of claim 3, wherein said translucent holder is operative in use to pick up said group of LEDs by contacting a surface of each LED other than a surface of each LED having electrical contacts.

9. The apparatus of claim 1, wherein said portion of said bond head comprises an optical assembly configured to redirect light emitted by each LED from a major light-emitting surface of each LED in an emission direction towards said bond head to a redirected direction which is transverse to said emission direction.

10. The apparatus of claim 9, wherein said optical sensor is mounted on a side of said bond head to align with said redirected direction.

11. The apparatus of claim 1, wherein said test station comprises a group of electrical contacts operative in use to power said group of LEDs during testing, and said bond head is operative in use to place said group of LEDs on said test station aligned with said group of electric contacts to power said group of LEDs when testing.

12. The apparatus of claim 1, comprising an electrical tester operative in use to measure electrical characteristics of said group of LEDs on said test station when testing.

13. The apparatus of claim 1, wherein said optical sensor is operative in use to identify defective LEDs within said group of LEDs which fail to achieve at least one of a selected threshold of a measured optical characteristic and a selected threshold of a measured electrical characteristic.

14. The apparatus of claim 1, further comprising a plurality of bin carriers, each bin carrier being operative to receive said group of LEDs from the bond head based on said measured optical characteristics, wherein a mixture of LEDs of different colour coordinates within each bin carrier share similar measured optical characteristics.

15. The apparatus of claim 1, further comprising a plurality of bin carriers, each bin carrier being operative to receive said group of LEDs from the bond head based on said measured optical characteristics, wherein a mixture of LEDs of different colour coordinates within each bin carrier fall within a range of measured optical characteristics for that bin carrier.

16. The apparatus of claim 1, further comprising a gang bonding carrier operative to receive groups of LEDs from the same bin carrier in a predetermined arrangement comprising a mixture of LEDs of different colour coordinates, and to bond such groups of LEDs onto an LED display system in the predetermined arrangement.

17. The apparatus of claim 1, further comprising a tool operative in use to perform at least one of a removal and a replacement of defective LEDs that are received on the gang bonding carrier.

18. The apparatus of claim 1, wherein said optical characteristic comprises at least one of an intensity and a colour coordinate of said group of LEDs.

19. The apparatus of claim 18, wherein said intensity comprises an average intensity of said group of LEDs and said colour coordinate comprises an average colour coordinate of said group of LEDs.

* * * * *